(12) United States Patent
Kumar et al.

(10) Patent No.: US 7,739,648 B2
(45) Date of Patent: Jun. 15, 2010

(54) FORMATION OF MASKS/RETICLES HAVING DUMMY FEATURES

(75) Inventors: Amit Kumar, Williston, VT (US); Howard Smith Landis, Underhill, VT (US); Jeanne-Tania Sucharitaves, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 549 days.

(21) Appl. No.: 11/673,611

(22) Filed: Feb. 12, 2007

(65) Prior Publication Data

US 2008/0195995 A1 Aug. 14, 2008

(51) Int. Cl.
*G06F 17/50* (2006.01)
(52) U.S. Cl. .............................. 716/19; 716/11; 716/21
(58) Field of Classification Search .................... 716/11, 716/19, 21
See application file for complete search history.

(56) References Cited

U.S. PATENT DOCUMENTS

| | | | |
|---|---|---|---|
| 6,258,489 B1 | 7/2001 | Stanton et al. | |
| 6,692,875 B2 | 2/2004 | Fischer et al. | |
| 7,014,955 B2 | 3/2006 | Chang et al. | |
| 7,039,889 B2 * | 5/2006 | Takahashi et al. | 716/9 |
| 2002/0116686 A1 | 8/2002 | Shin et al. | |
| 2004/0063038 A1 | 4/2004 | Shin et al. | |
| 2004/0107412 A1 | 6/2004 | Pack et al. | |
| 2004/0256712 A1 | 12/2004 | Ozawa et al. | |
| 2005/0076320 A1 | 4/2005 | Maeda | |
| 2005/0139575 A1 | 6/2005 | Lee | |
| 2005/0205961 A1 | 9/2005 | Doong | |
| 2005/0250330 A1 | 11/2005 | Chen et al. | |

OTHER PUBLICATIONS

PCT International Search Report and the Written Opinion of the International Searching Authority; Date of Mailing Jul. 25, 2008; Applicant's file reference BUR920060138; International application No. PCT/US 08/53694; International filing date Feb. 12, 2008; 3 pages.

* cited by examiner

*Primary Examiner*—Thuan Do
(74) *Attorney, Agent, or Firm*—Schmeiser, Olsen & Watts; Richard M. Kotulak (57) ABSTRACT

Structures and methods for forming the same. The method includes providing design information of a design layer. The design layer includes M original design features and N original dummy features. The method further includes (i) creating a cluster of P representative dummy features, P being a positive integer less than N, (ii) performing OPC for the cluster of the P representative dummy features but not for the N original dummy features, resulting in P OPC-applied representative dummy features, and (iii) forming the mask including N mask dummy features. The N mask dummy features are identical. Each mask dummy feature of the N mask dummy features of the mask has an area which is a function of at least an area of an OPC-applied representative dummy feature of the P OPC-applied representative dummy features. The N mask dummy features have the same relative positions as the N original dummy features.

35 Claims, 6 Drawing Sheets

FORMATION OF MASKS/RETICLES HAVING DUMMY FEATURES

FIELD OF THE INVENTION

The present invention relates to formation of masks/reticles, and more specifically, to formation of the masks/reticles having dummy features.

BACKGROUND OF THE INVENTION

In a conventional process of forming a mask for a design layer having M original design features and N original dummy features, an OPC (Optical Proximity Correction) program is typically run on characteristic data sets of the M original design features and the N original dummy features resulting in OPC-applied characteristic data sets of M OPC-applied design features and N OPC-applied dummy features, respectively. Next, the mask is formed from the OPC-applied characteristic data sets of the M OPC-applied design features, and the N OPC-applied dummy features. The numbers M and N are usually very large, and therefore running OPC program consumes a lot of time. Therefore, there is a need for a method for forming the mask that takes less time than in the prior.

SUMMARY OF THE INVENTION

The present invention provides a method of forming a mask, comprising providing design information of a design layer, wherein the design layer includes M original design features and N original dummy features, M and N being positive integers; creating a design cluster of P representative dummy features, P being a positive integer and less than N; performing OPC (Optical Proximity Correction) for the design cluster of the P representative dummy features but not for the N original dummy features, resulting in P OPC-applied representative dummy features such that if the P OPC-applied representative dummy features were printed on the mask and if a lithographic process was performed on a photoresist layer through the printed mask, then the P representative dummy features would be created in the photoresist layer; forming the mask including N mask dummy features, wherein the N mask dummy features are identical, wherein each mask dummy feature of the N mask dummy features of the mask has an area which is a function of at least an area of an OPC-applied representative dummy feature of the P OPC-applied representative dummy features, and wherein the N mask dummy features have the same relative positions as the N original dummy features.

The present invention provides a computer system of claim 26, wherein said creating the design cluster of the P representative dummy features comprises superimposing a square of a predetermined size on an area of the design layer such that only P original dummy features of the N original dummy features are inside the square; and using the area limited by the square as the design cluster of the P representative dummy features.

The present invention provides a method for forming the mask that takes less time than in the prior.

DETAILED DESCRIPTION OF THE INVENTION

Figure 1:
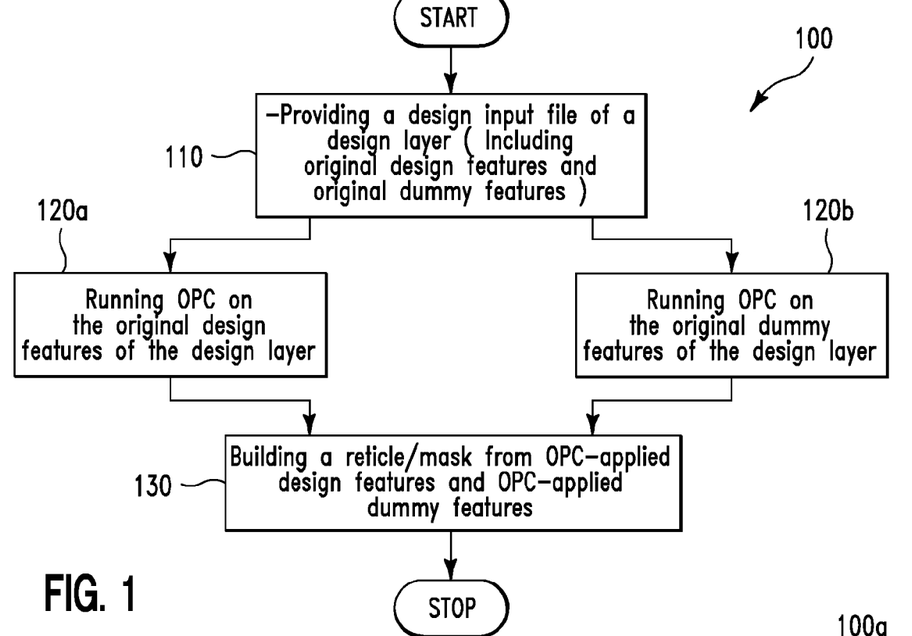
FIG. 1 shows a flowchart of a method, in accordance with embodiments of the present invention.
Figure 1A:
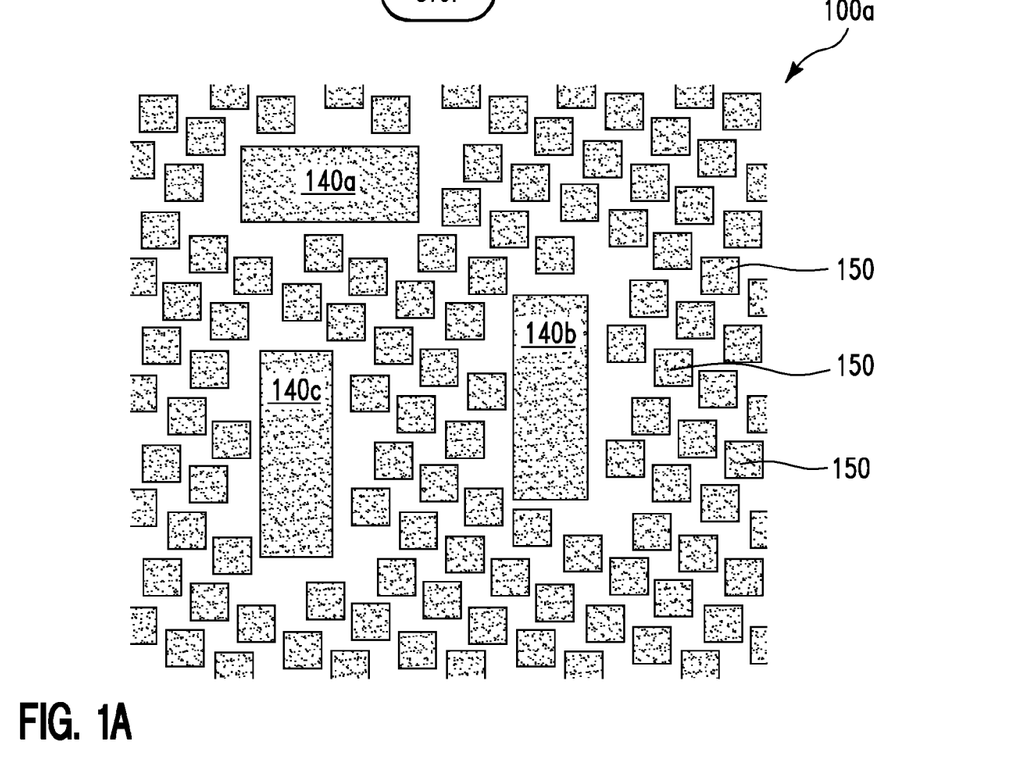
FIGS. 1A and 1B illustrate the layout of the present invention.

FIG. 1 shows a flowchart of a method 100, in accordance with embodiments of the present invention. The method 100 is for forming a photo mask/reticle (hereinafter, referred to as a mask) (not shown) for a design layer 100a (FIG. 1A, top down view). The design layer 100a (FIG. 1A) includes original design features 140a, 140b, and 140c, and original dummy features 150. It should be noted that the design layer 100a may have large numbers of the original design features and the original dummy features but only the original design features 140a, 140b, and 140c, and the original dummy features 150 are shown for simplicity. As an example, assume that the design layer 100a has fifty thousand (50,000) features including ten thousand (10,000) original design features (similar to the original design features 140a, 140b, and 140c of FIG. 1A) and forty thousand (40,000) original dummy features (similar to the original dummy features 150 of FIG. 1A). This example will be referred to further below.

The original design features 140a, 140b, and 140c are features that are necessary for the operation of the design, whereas the original dummy features 150 are features that are not necessary for the operation of the design but are included in the design to make the pattern density of the mask more uniform across the design layer 100a during the fabrication process. In one embodiment, the original design features 140a, 140b, and 140c can be design trenches (not shown) in an interlevel dielectric layer, which are to be filled to form electrically conductive lines (not shown), whereas the original dummy features 150 can be dummy trenches, which are to be filled to form dummy lines (not shown). The detailed method 100 is as follows.

In one embodiment, the method 100 starts with a step 110 (FIG. 1) in which a design input file of the design layer 100a (FIG. 1A) is provided. The design input file contains a characteristic data set for each feature of the original design features 140a, 140b, and 140c, and the original dummy features 150. The characteristic data set contains such information as shape, size, position, etc of the feature. All of the original dummy features 150 have the same shape and size. The original dummy features 150 have square shapes.

Figure 1B:
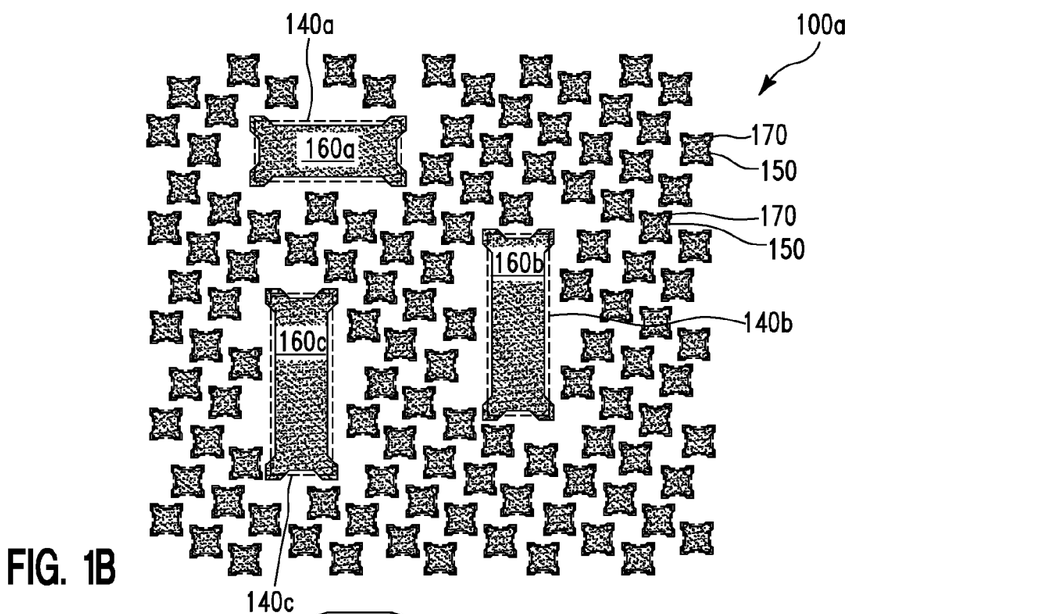

Next, in one embodiment, steps 120a and 120b (FIG. 1) are performed. It should be noted that the steps 120a and 120b can be performed in any order. In the step 120a, an optical proximity correction (OPC) program is run on the characteristic data sets of the original design features 140a, 140b, and 140c (FIG. 1A) resulting in OPC-applied characteristic data sets of OPC-applied design features 160a, 160b, and 160c (FIG. 1B), respectively. It should be noted that the original design features 140a, 140b, and 140c are also shown in FIG. 1B as dotted lines for comparison. The OPC program is run on one characteristic data set of an original design feature after another. OPC is a photolithography enhancement technique commonly used to compensate for design errors due to diffraction or process effects. The OPC program is a software run by a computer system (not shown). In the example above, the OPC program is run on the 10,000 characteristic data sets of the 10,000 original design features (similar to the original design features 140a, 140b, and 140c of FIG. 1A) resulting in the 10,000 OPC-applied characteristic data sets of 10,000 OPC-applied design features (similar to the OPC-applied design features 160a, 160b, and 160c of FIG. 1B), respectively.

In the step 120b (FIG. 1), in one embodiment, the OPC program is run on the characteristic data sets of the original dummy features 150 (FIG. 1A) resulting in OPC-applied characteristic data sets of OPC-applied dummy features 170 (FIG. 1B), respectively. It should be noted that the original dummy features 150 are also shown in FIG. 1B as dotted lines for comparison. The OPC program is run on one characteristic data set of an original dummy feature 150 after another. In the example above, the OPC program is run on the 40,000 characteristic data sets of the 40,000 original dummy features (similar to the original dummy features 150 of FIG. 1A) resulting in the 40,000 OPC-applied dummy features of 40,000 OPC-applied dummy features (similar to the OPC-applied dummy features 170 of FIG. 1B), respectively.

Next, in step 130 (FIG. 1), in one embodiment, the mask is built from the OPC-applied characteristic data sets of (i) the OPC-applied design features 160a, 160b, and 160c (the result of step 120a), and (ii) the OPC-applied dummy features 170 (the result of step 120b). In the example above, the mask is built having the 10,000 OPC-applied design features and the 40,000 OPC-applied dummy features.

Figure 2:
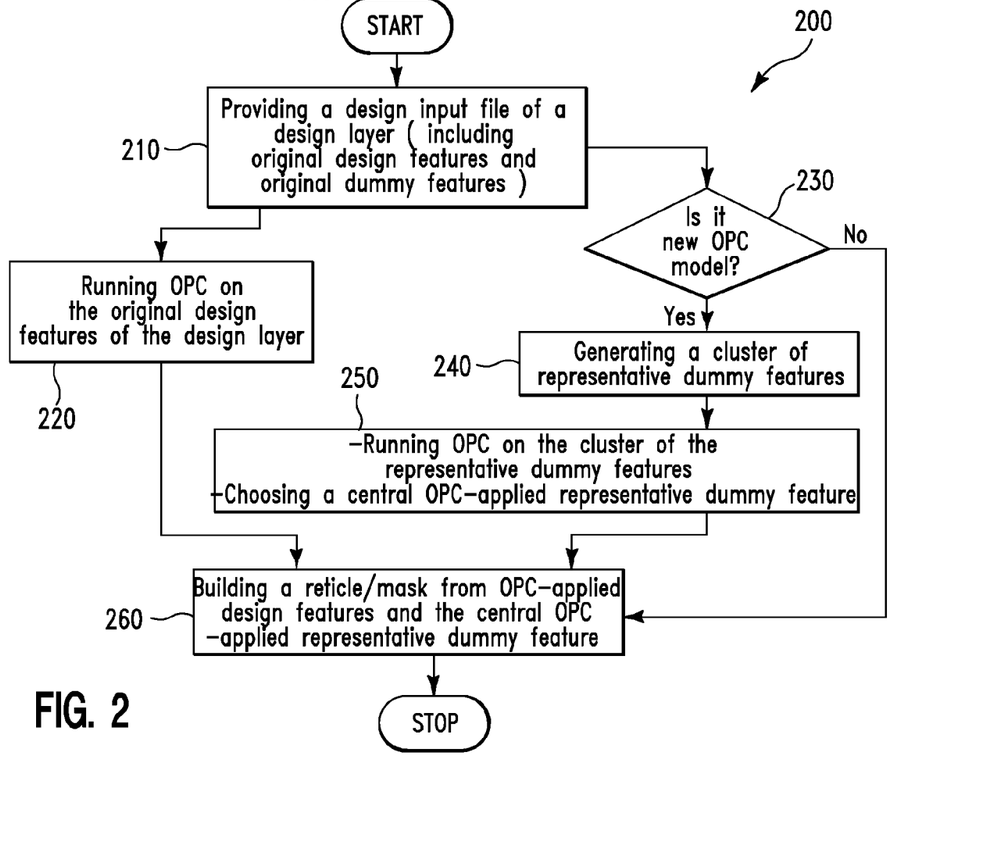
FIG. 2 shows a flowchart of another method, in accordance with embodiments of the present invention.

FIG. 2 shows a flowchart of a method 200, in accordance with embodiments of the present invention. The method 200 is for forming a photo mask/reticle (hereinafter, referred to as a mask) (not shown) for the design layer 100a (FIG. 1A, top down view). The detailed method 200 is as follows.

In one embodiment, the method 200 starts with a step 210 (FIG. 2). The step 210 of the method 200 is similar to the step 110 of the method 100 (FIG. 1).

Next, in one embodiment, steps 220 and 230 (FIG. 2) are performed. The step 220 of the method 200 is similar to the step 120a of the method 100 (FIG. 1). In the example above, the OPC program is run on the 10,000 characteristic data sets of the 10,000 original design features (similar to the original design features 140a, 140b, and 140c of FIG. 1A) resulting in 10,000 OPC-applied characteristic data sets of 10,000 OPC-applied design features (similar to the OPC-applied design features 160a, 160b, and 160c of FIG. 1B), respectively.

In the step 230 (FIG. 2), in one embodiment, it is determined whether the OPC model is new. If no, then this means that steps 240 and 250 have previously been performed for this OPC model already. Therefore, a step 260 of the method 200 is performed. If the answer to the question in the step 230 is affirmative, then the step 240 of the method 200 is performed.

Figure 3A:
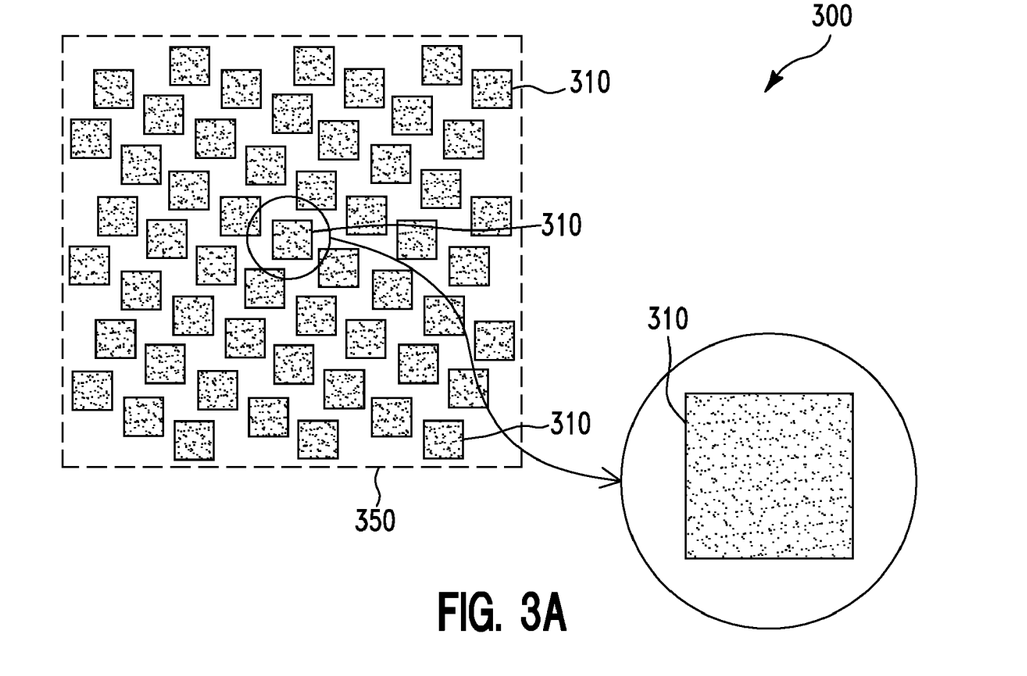
FIGS. 3A and 3B illustrate a method of choosing a central OPC-applied representative dummy feature, in accordance with embodiments of the present invention.

In the step 240, in one embodiment, a design cluster 300 of representative dummy features 310 (FIG. 3A, top down view) is generated. More specifically, in one embodiment, the design cluster 300 is generated by superimposing an imaginary square 350 of a predetermined size on an area of the design layer 100a (FIG. 1A) such that only original dummy features 150 are inside the square 350. Then, such area can be used as the design cluster 300, and therefore, the original dummy features 150 inside the square 350 become the representative dummy features 310 of FIG. 3A. The number of the representative dummy features 310 of the design cluster 300 can be less than two hundred. The circle on the right of FIG. 3A is an enlarged view of one representative dummy feature 310. In the example above, the generated design cluster 300 comprises, illustratively, one hundred (100) representative dummy features 310 (as shown in FIG. 3A) that represent the 40,000 original dummy features 150 (FIG. 1A).

Figure 3B:
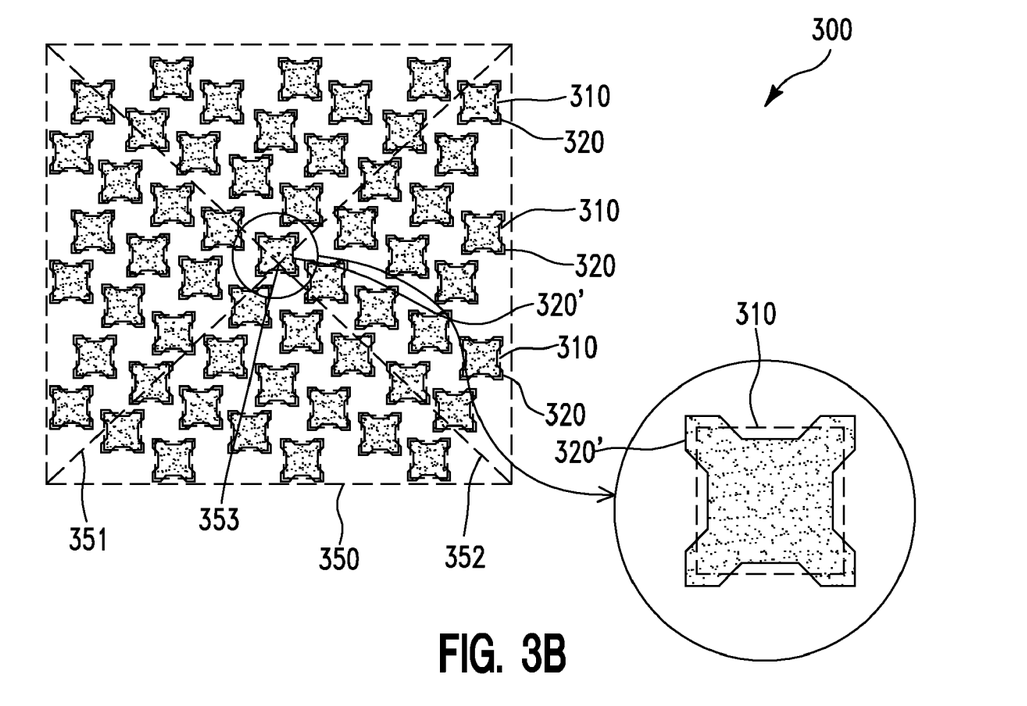

Next, in the step 250 (FIG. 2), in one embodiment, the OPC program is run on the characteristic data sets of the representative dummy features 310 (FIG. 3A) resulting in OPC-applied characteristic data sets of OPC-applied representative dummy features 320 (FIG. 3B), respectively. It should be noted that the representative dummy features 310 are also shown in FIG. 3B as dotted lines for comparison. In the example above, the OPC program is run on the 100 characteristic data sets of the 100 representative dummy features 310 resulting in the 100 OPC-applied characteristic data sets of the 100 OPC-applied representative dummy features 320, respectively.

Next, in one embodiment, a central OPC-applied representative dummy feature 320' is chosen as follows. Firstly, an intersection point 353 of two diagonals 351 and 352 of the imaginary square 350 is determined (as shown in FIG. 3B). Next, if the intersection point 353 is within an OPC-applied representative dummy feature, that OPC-applied representative dummy feature is chosen as the central OPC-applied representative dummy feature 320'. If the intersection point 353 is not within any the OPC-applied representative dummy features 320, the OPC-applied representative dummy feature nearest the intersection point 353 is chosen as the central OPC-applied representative dummy feature 320'. In FIG. 3B, the central OPC-applied representative dummy feature 320' is circled and the large circle on the right of FIG. 3B is an enlarged view of the central OPC-applied representative dummy feature 320'.

Next, in step 260 (FIG. 2), in one embodiment, the mask is built from the OPC-applied characteristic data sets of (i) the OPC-applied design features (similar to the OPC-applied design features 160a, 160b, and 160c of FIG. 1B), and (ii) the central OPC-applied representative dummy feature 320'. In the example above, the mask is built having the 10,000 OPC-applied design features (the result of step 220) and 40,000 mask dummy features identical in terms of size and shape to the central OPC-applied representative dummy feature 320'. The 40,000 mask dummy features are located at the same locations as the 40,000 original dummy features. Therefore, the mask dummy features (i.e., the 40,000 mask dummy in this example) have the same relative positions as the original dummy features (i.e., the 40,000 original dummy features in this example.

In summary, instead of running the OPC program on the 40,000 characteristic data sets of the 40,000 original dummy features as in method 100, the OPC program is run on only the 100 characteristic data sets of the 100 representative dummy features 310 as in method 200. The OPC program is not run on the 40,000 original dummy features. Then, one of the resulting 100 OPC-applied representative dummy features 320 (i.e. the central OPC-applied representative dummy feature 320') is used for forming all 40,000 mask dummy features of the mask. As a result, the 40,000 mask dummy features are identical in terms of size and shape to the central OPC-applied representative dummy feature 320'. The resulting 100 OPC-applied representative dummy features are such that: if the 100 OPC-applied representative dummy features were printed on the mask and if a lithographic process was performed on a photoresist layer through the printed mask, then the 100 representative dummy features would be created in the photoresist layer.

Figure 4:
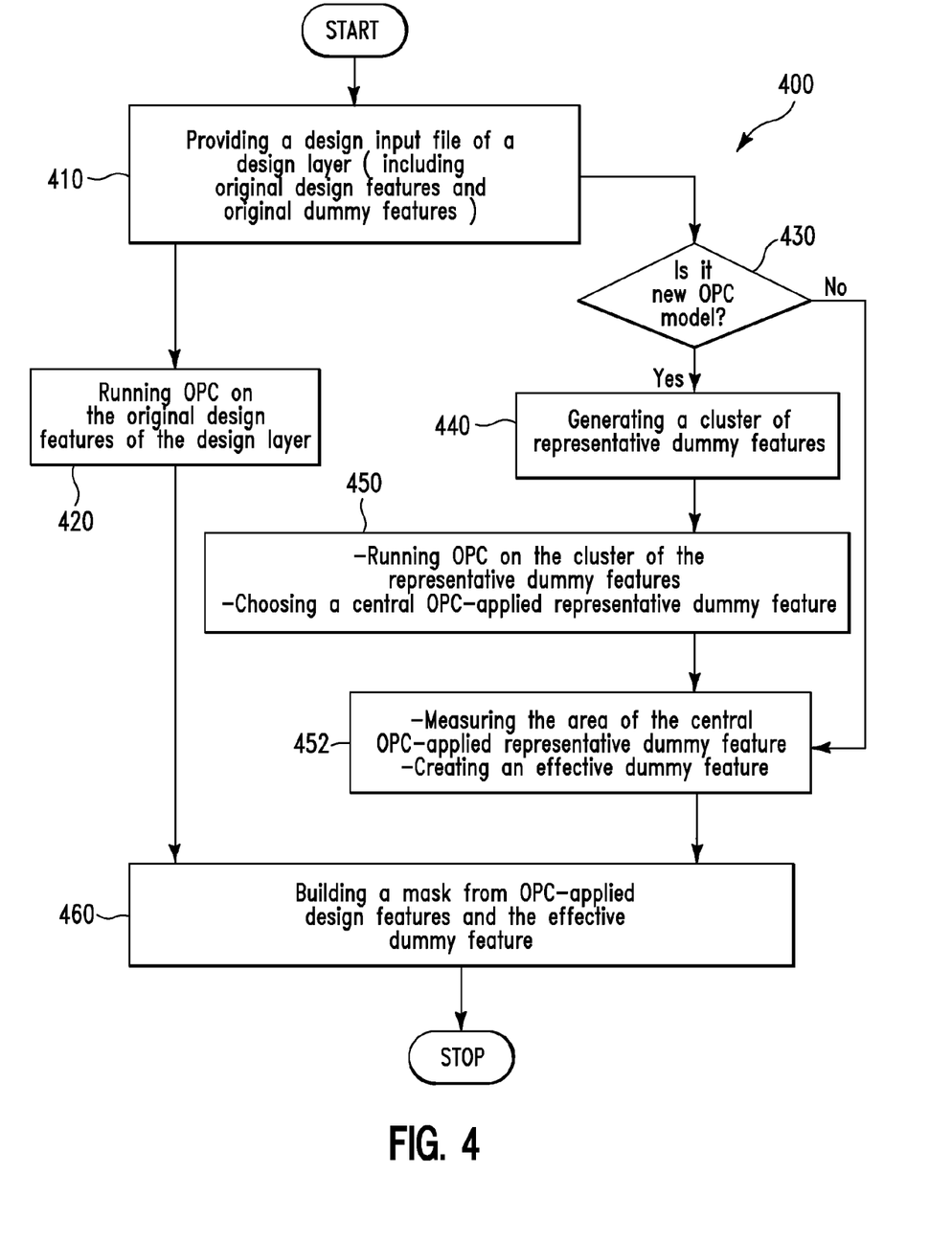
FIG. 4 shows a flowchart of yet another method, in accordance with embodiments of the present invention.

FIG. 4 shows a flowchart of a method 400, in accordance with embodiments of the present invention. The method 400 is for forming a photo mask/reticle (hereinafter, referred to as a mask) (not shown) for the design layer 100a (FIG. 1A, top down view). The detailed method 400 is as follows.

In one embodiment, the method 400 starts with a step 410 (FIG. 4). The step 410 of the method 400 is similar to the step 110 of the method 100 (FIG. 1).

Next, in one embodiment, steps 420 and 430 (FIG. 2) are performed. The step 420 of the method 400 is similar to the step 120a of the method 100 (FIG. 1). In the example above, the OPC program is run on the 10,000 characteristic data sets of the 10,000 original design features (similar to the original design features 140a, 140b, and 140c of FIG. 1A) resulting in 10,000 OPC-applied characteristic data sets of 10,000 OPC-applied design features (similar to the OPC-applied design features 160a, 160b, and 160c of FIG. 1B), respectively.

In the step 430 (FIG. 4), in one embodiment, it is determined whether the OPC model is new. If no, then this means that steps 440, 450, and 452 have previously been performed for this OPC model already. Therefore, a step 460 of the method 400 is performed. If the answer to the question in the step 430 is affirmative, then the step 440 of the method 400 is performed.

Figure 5A:
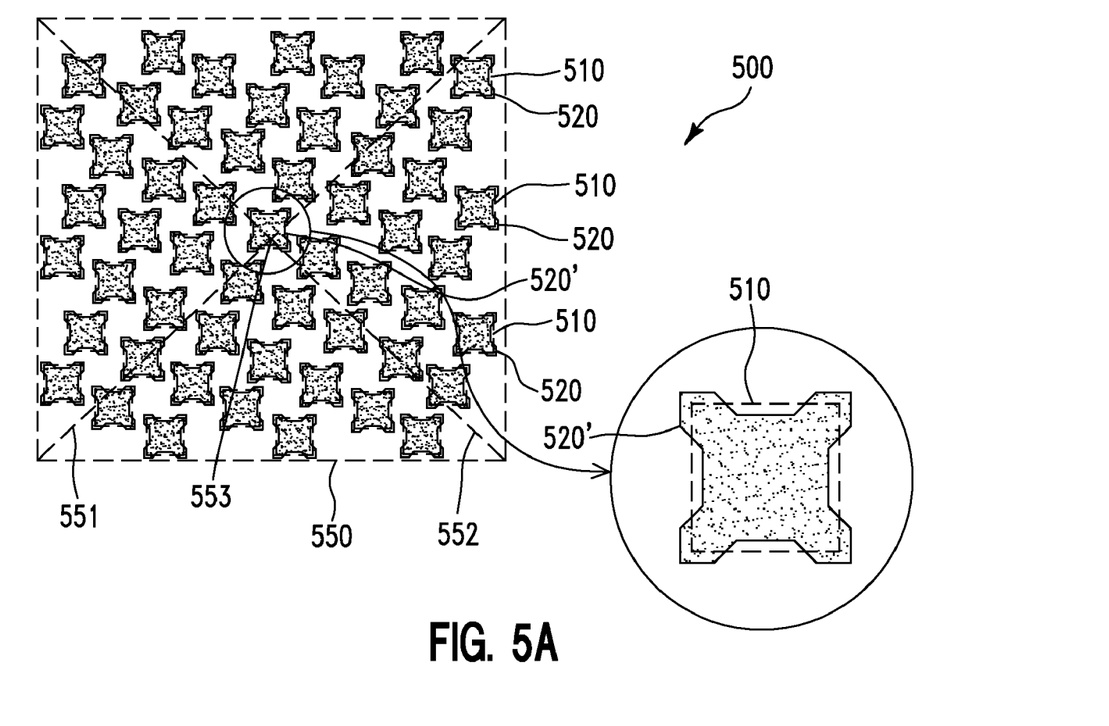
FIGS. 5A and 5B illustrate a method of forming an effective dummy feature, in accordance with embodiments of the present invention.

In the step 440, in one embodiment, a design cluster 500 (similar to the design cluster 300 of FIG. 3A) of representative dummy features 510 (as shown in FIG. 5A as dotted lines for comparison) is generated. The step 440 of the method 400 is similar to the step 240 of the method 200. In the example above, the design cluster 500 comprises, illustratively, 100 representative dummy features 510 (FIG. 5A) that represent the 40,000 original dummy features 150 (FIG. 1A).

Next, in the step 450 (FIG. 4), in one embodiment, the OPC program is run on the characteristic data sets of the representative dummy features 510 (FIG. 5A) resulting in OPC-applied characteristic data sets of OPC-applied representative dummy features 520 (as shown in FIG. 5A), respectively. Next, a central OPC-applied representative dummy feature 520' is chosen. The step 450 of the method 400 is similar to the step 250 of the method 200. In the example above, the OPC program is run on the 100 characteristic data sets of the 100 representative dummy features 510 resulting in the 100 OPC-applied characteristic data sets of the 100 OPC-applied representative dummy features 520, respectively. In FIG. 5A, the central OPC-applied representative dummy feature 520' is circled and the large circle on the right of FIG. 5A is an enlarged view of the central OPC-applied representative dummy feature 520'.

Figure 5B:
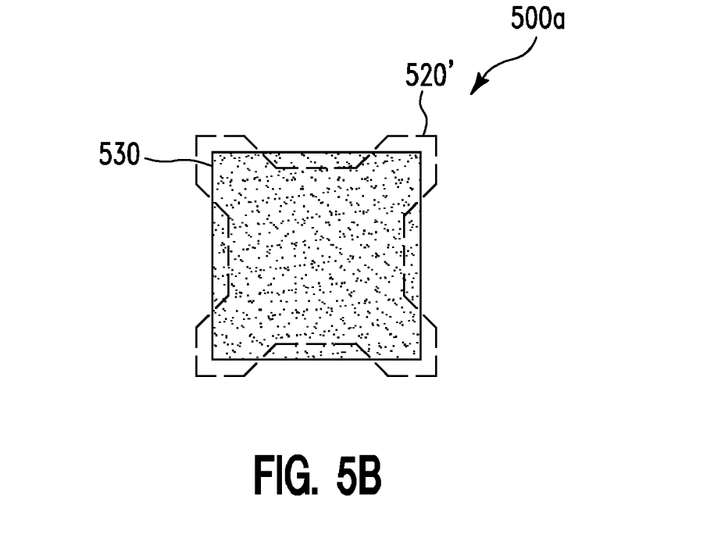

Next, in the step 452 (FIG. 4), in one embodiment, the area of the central OPC-applied representative dummy feature 520' is measured. Next in a first embodiment, an effective dummy feature 530 (as shown in FIG. 5B) is created whose area is equal to the area of the central OPC-applied representative dummy feature 520' (as shown in FIG. 5B as dotted line for comparison). In a second embodiment, the area of the effective dummy feature 530 is equal to the average area of the 100 OPC-applied representative dummy features 520 (in the example above). The effective dummy feature 530 has a square shape. Therefore, the effective dummy feature 530 of the mask has an area which is a function of at least an area of an OPC-applied representative dummy feature 520'. As examples, the area of the effective dummy feature 530 is equal to: (i) the area of the central OPC-applied representative dummy feature 520' in the preceding first embodiment: and (ii) average area of the 100 OPC-applied representative dummy features 520 in the preceding first embodiment.

Next, in step 460 (FIG. 4), in one embodiment, the mask is built from the OPC-applied characteristic data sets of (i) the OPC-applied design features (similar to the OPC-applied design features 160a, 160b, and 160c of FIG. 1B), and (ii) the effective dummy feature 530 of the FIG. 5B. In the example above, the mask is built having the 10,000 OPC-applied design features (the result of step 420) and the 40,000 mask dummy features identical in terms of size and shape to the effective dummy feature 530. The 40,000 mask dummy features are located at the same locations as the 40,000 original dummy features.

In summary, instead of running the OPC program on the 40,000 characteristic data sets of the 40,000 original dummy features as in method 100, the OPC program is run on only the 100 characteristic data sets of the 100 representative dummy features 510 as in method 400. Then, the effective dummy feature 530 is created and used for forming all 40,000 mask dummy features of the mask. As a result, the 40,000 mask dummy features are identical in terms of size and shape to the effective dummy feature 530. In the embodiments described above, the design information of the design layer 100a (FIG. 1A) can be stored in a design file which in turn can be stored in a memory device (not shown) such as a computer hard disk. The design clusters 300 and 500 (FIGS. 3A and 5A, respectively) can be stored in a separate file which can be stored in the same hard disk as the design file or in a different memory device. The OPC-applied features (design or dummy) can also be stored in files which can be stored in the same memory device as the design file or in a different memory devices.

Figure 6:
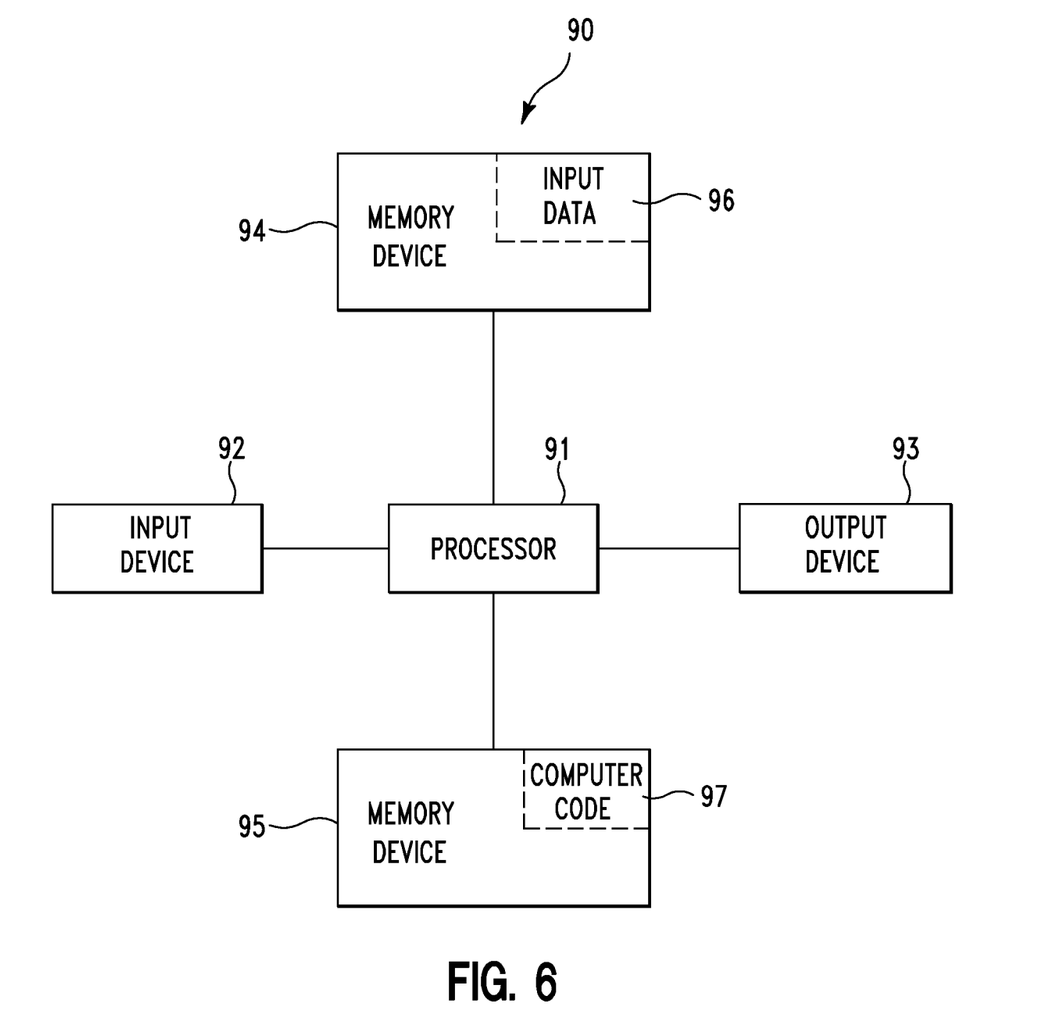
FIG. 6 illustrates a computer system used for creating a mask for lithography including design features and dummy features, in accordance with embodiments of the present invention.

FIG. 6 illustrates a computer system 90 used for creating a mask for lithography including design features and dummy features, in accordance with embodiments of the present invention. The computer system 90 comprises a processor 91, an input device 92 coupled to the processor 91, an output device 93 coupled to the processor 91, and memory devices 94 and 95 each coupled to the processor 91. The input device 92 may be, inter alia, a keyboard, a mouse, etc. The output device 93 may be, inter alia, a printer, a plotter, a computer screen, a magnetic tape, a removable hard disk, a floppy disk, etc. The memory devices 94 and 95 may be, inter alia, a hard disk, a floppy disk, a magnetic tape, an optical storage such as a compact disc (CD) or a digital video disc (DVD), a dynamic random access memory (DRAM), a read-only memory (ROM), etc. The memory device 95 includes a computer code 97. The computer code 97 includes an algorithm for creating a mask for lithography including design features and dummy features. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices not shown in FIG. 9) may be used as a computer usable medium (or a computer readable medium or a program storage device) having a computer readable program code embodied therein and/or having other data stored therein, wherein the computer readable program code comprises the computer code 97. Generally, a computer program product (or, alternatively, an article of manufacture) of the computer system 90 may comprise said computer usable medium (or said program storage device).

While FIG. 6 shows the computer system 90 as a particular configuration of hardware and software, any configuration of hardware and software, as would be known to a person of ordinary skill in the art, may be utilized for the purposes stated supra in conjunction with the particular computer system 90 of FIG. 6. For example, the memory devices 94 and 95 may be portions of a single memory device rather than separate memory devices.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A method of forming a mask, comprising:
providing design information of a design layer, wherein the design layer includes M original design features and N original dummy features, M and N being positive integers;
creating a design cluster of P representative dummy features, P being a positive integer and less than N;
performing OPC (Optical Proximity Correction) for the design cluster of the P representative dummy features but not for the N original dummy features, resulting in P OPC-applied representative dummy features such that if the P OPC-applied representative dummy features were printed on the mask and if a lithographic process was performed on a photoresist layer through the printed mask, then the P representative dummy features would be created in the photoresist layer;
forming the mask including N mask dummy features,
wherein the N mask dummy features are identical,
wherein each mask dummy feature of the N mask dummy features of the mask has an area which is a function of at least an area of an OPC-applied representative dummy feature of the P OPC-applied representative dummy features, and
wherein the N mask dummy features have the same relative positions as the N original dummy features.

2. The method of claim 1, wherein the design information is included in a design input file.

3. The method of claim 1, wherein all of the N original dummy features have the same shape and size.

4. The method of claim 1, wherein the N original dummy features have square shape.

5. The method of claim 1, wherein the N mask dummy features have square shape.

6. The method of claim 1, further comprising performing OPC for the M original design features resulting in M OPC-applied design features such that if the M OPC-applied design features were printed on the mask and if a lithographic process was performed on a photoresist layer through the printed mask, then the M original design features would be created in the photoresist layer.

7. The method of claim 6, wherein the mask further includes M mask design features which are identical in terms of size and shape to the M OPC-applied design features.

8. The method of claim 1, wherein said creating the design cluster of the P representative dummy features comprises:
superimposing a square of a predetermined size on an area of the design layer such that only P original dummy features of the N original dummy features are inside the square; and
using the area limited by the square as the design cluster of the P representative dummy features.

9. The method of claim 8, further comprising, after said creating the design cluster of P representative dummy features is performed, selecting an OPC-applied representative dummy feature of the P OPC-applied representative dummy features, wherein if an intersection point of two diagonals of the square is not within any OPC-applied representative dummy feature of the P OPC-applied representative dummy features, the selected OPC-applied representative dummy feature is nearest the intersection point, and
wherein if the intersection point of the two diagonals of the square is within an OPC-applied representative dummy feature of the P OPC-applied representative dummy features, the selected OPC-applied representative dummy feature includes the intersection point.

10. The method of claim 9, wherein the N mask dummy features are identical in terms of size and shape to the selected OPC-applied representative dummy feature.

11. The method of claim 9, wherein the area of each mask dummy feature of the N mask dummy features is equal to an area of the selected OPC-applied representative dummy feature.

12. The method of claim 1, wherein the area of each mask dummy feature of the N mask dummy features is equal to an average area of the P OPC-applied representative dummy features.

13. A method of forming a mask, comprising:
providing design information of a design layer, wherein the design layer includes M original design features and N original dummy features, M and N being positive integers; creating a design cluster of P representative dummy features, P being a positive integer and less than N;
performing OPC (Optical Proximity Correction) for the M original design features and the design cluster of the P representative dummy features but not for the N original dummy features, resulting in M OPC-applied design features and P OPC-applied representative dummy features, respectively such that if the M OPC-applied design features and P OPC-applied representative dummy features were printed on the mask and if a lithographic process was performed on a photoresist layer through the printed mask, then the M original design features and the design cluster of the P representative dummy features would be created in the photoresist layer;
creating an effective dummy feature, wherein the effective dummy feature has an area which is a function of at least an area of an OPC-applied representative dummy feature of the P OPC-applied representative dummy features; and
forming the mask including M mask design features and N mask dummy features,
wherein the M mask design features are identical in terms of size and shape to the M OPC-applied design features,
wherein the M mask design features have the same relative positions as the M original design features,
wherein the N mask dummy features are identical in terms of size and shape to the effective dummy feature, and
wherein the N mask dummy features have the same relative positions as the N original dummy features.

14. The method of claim 13, wherein the effective dummy feature has square shape.

15. The method of claim 13, wherein said creating the design cluster of the P representative dummy features comprises:
superimposing a square of a predetermined size on an area of the design layer such that only P original dummy features of the N original dummy features are inside the square; and
using the area limited by the square as the design cluster of the P representative dummy features.

16. The method of claim 15, further comprising, after said creating the design cluster of P representative dummy features is performed, selecting an OPC-applied representative dummy feature of the P OPC-applied representative dummy features,
  wherein if an intersection point of two diagonals of the square is not within any OPC-applied representative dummy feature of the P OPC-applied representative dummy features, the selected OPC-applied representative dummy feature is nearest the intersection point, and
  wherein if the intersection point of the two diagonals of the square is within an OPC-applied representative dummy feature of the P OPC-applied representative dummy features, the selected OPC-applied representative dummy feature includes the intersection point.

17. The method of claim 15, wherein the area of the effective dummy feature is equal to an area of the selected OPC-applied representative dummy feature.

18. The method of claim 13, wherein the area of the effective dummy feature is equal to an average area of the P OPC-applied representative dummy features.

19. A computer system comprising a processor and a computer readable memory unit coupled to the processor, said memory unit containing instructions that when executed by the processor implement a method for creating a design of a mask, said method comprising the computer-implemented steps of:
  receiving design information of a design layer, wherein the design layer includes M original design features and N original dummy features, M and N being positive integers;
  creating a design cluster of P representative dummy features, P being a positive integer and less than N;
  performing OPC (Optical Proximity Correction) for the design cluster of the P representative dummy features but not for the N original dummy features, resulting in P OPC-applied representative dummy features such that if the P OPC-applied representative dummy features were printed on the mask and if a lithographic process was performed on a photoresist layer through the printed mask, then the P representative dummy features would be created in the photoresist layer; and
  creating the design of the mask, said mask including N mask dummy features,
  wherein the N mask dummy features are identical,
  wherein each mask dummy feature of the N mask dummy features of the mask has an area which is a function of at least an area of an OPC-applied representative dummy feature of the P OPC-applied representative dummy features, and
  wherein the N mask dummy features have the same relative positions as the N original dummy features.

20. The computer system of claim 19, wherein the N mask dummy features have square shape.

21. The computer system of claim 19, wherein said method further comprises the step of performing OPC for the M original design features resulting in M OPC-applied design features such that if the M OPC-applied design features were printed on the mask and if a lithographic process was performed on a photoresist layer through the printed mask, then the M original design features would be created in the photoresist layer.

22. The computer system of claim 21, wherein the mask further includes M mask design features which are identical in terms of size and shape to the M OPC-applied design features.

23. The computer system of claim 19, wherein said creating the design cluster of the P representative dummy features comprises:
  superimposing a square of a predetermined size on an area of the design layer such that only P original dummy features of the N original dummy features are inside the square; and
  using the area limited by the square as the design cluster of the P representative dummy features.

24. The computer system of claim 23, wherein said method further comprising, after said creating the design cluster of P representative dummy features is performed, selecting an OPC-applied representative dummy feature of the P OPC-applied representative dummy features,
  wherein if an intersection point of two diagonals of the square is not within any OPC-applied representative dummy feature of the P OPC-applied representative dummy features, the selected OPC-applied representative dummy feature is nearest the intersection point, and
  wherein if the intersection point of the two diagonals of the square is within an OPC-applied representative dummy feature of the P OPC-applied representative dummy features, the selected OPC-applied representative dummy feature includes the intersection point.

25. The computer system of claim 24, wherein the N mask dummy features are identical in terms of size and shape to the selected OPC-applied representative dummy feature.

26. A computer program product, comprising a computer readable storage medium having a computer readable program code stored therein, wherein the computer readable program code upon being executed by a processor of a computer system implements a method for creating a design of a mask, said method comprising:
  receiving design information of a design layer, wherein the design layer includes M original design features and N original dummy features, M and N being positive integers; creating a design cluster of P representative dummy features, P being a positive integer and less than N;
  performing OPC (Optical Proximity Correction) for the design cluster of the P representative dummy features but not for the N original dummy features, resulting in P OPC-applied representative dummy features such that if the P OPC-applied representative dummy features were printed on the mask and if a lithographic process was performed on a photoresist layer through the printed mask, then the P representative dummy features would be created in the photoresist layer; and
  creating the design of the mask, said mask including N mask dummy features,
  wherein the N mask dummy features are identical,
  wherein each mask dummy feature of the N mask dummy features of the mask has an area which is a function of at least an area of an OPC-applied representative dummy feature of the P OPC-applied representative dummy features, and
  wherein the N mask dummy features have the same relative positions as the N original dummy features.

27. The computer program product of claim 26, wherein P is less than two hundred.

28. The computer program product of claim 26,
  wherein said creating the design cluster of the P representative dummy features comprises: superimposing a square of a predetermined size on an area of the design layer such that only P original dummy features of the N original dummy features are inside the square; and using the area limited by the square as the design cluster of the P representative dummy feature, and said method further comprising, after said creating the design cluster of P representative dummy features is performed, selecting an OPC-applied representative dummy feature of the P OPC-applied representative dummy features, wherein if an intersection point of two diagonals of the square is not within any OPC-applied representative dummy feature of the P OPC-applied representative dummy features, the selected OPC-applied representative dummy feature is nearest the intersection point, and wherein if the intersection point of the two diagonals of the square is within an OPC-applied representative dummy feature of the P OPC-applied representative dummy features, the selected OPC-applied representative dummy feature includes the intersection point.

29. The computer program product of claim 28, wherein the selected OPC-applied representative dummy feature of the P OPC-applied representative dummy features is nearest the intersection point of two diagonals of the square and the intersection point is not within any OPC-applied representative dummy feature of the P OPC-applied representative dummy features.

30. The computer program product of claim 28, wherein the intersection point of two diagonals of the square is within the selected OPC-applied representative dummy feature of the P OPC-applied representative dummy features.

31. A method of forming a mask, comprising:

providing design information of a design layer, wherein the design layer includes M original design features and N original dummy features, M and N being positive integers;

creating a design cluster of P representative dummy features, P being a positive integer and less than N;

performing OPC (Optical Proximity Correction) for the M original design features and the design cluster of the P representative dummy features but not for the N original dummy features, resulting in M OPC-applied design features and P OPC-applied representative dummy features, respectively such that if the M OPC-applied design features and P OPC-applied representative dummy features were printed on the mask and if a lithographic process was performed on a photoresist layer through the printed mask, then the M original design features and the design cluster of the P representative dummy features would be created in the photoresist layer;

selecting an OPC-applied representative dummy feature of the P OPC-applied representative dummy features; and forming the mask including M mask design features and N mask dummy features, wherein the M mask design features have the same relative positions as the M original design features, and wherein the N mask dummy features have the same relative positions as the N original dummy features.

32. The method of claim 31, wherein the M mask design features are identical in terms of size and shape to the M OPC-applied design features, and wherein the N mask dummy features are identical in terms of shape to the selected OPC-applied representative dummy feature of the P OPC-applied representative dummy features.

33. The method of claim 31, wherein said creating the design cluster of the P representative dummy features comprises: superimposing a square of a predetermined size on an area of the design layer such that only P original dummy features of the N original dummy features are inside the square; and using the area limited by the square as the design cluster of the P representative dummy feature, and said method further comprising, after said creating the design cluster of P representative dummy features is performed, selecting an OPC-applied representative dummy feature of the P OPC-applied representative dummy features, wherein if an intersection point of two diagonals of the square is not within any OPC-applied representative dummy feature of the P OPC-applied representative dummy features, the selected OPC-applied representative dummy feature is nearest the intersection point, and wherein if the intersection point of the two diagonals of the square is within an OPC-applied representative dummy feature of the P OPC-applied representative dummy features, the selected OPC-applied representative dummy feature includes the intersection point.

34. The method of claim 33, wherein the selected OPC-applied representative dummy feature of the P OPC-applied representative dummy features is nearest the intersection point of two diagonals of the square and the intersection point is not within any OPC-applied representative dummy feature of the P OPC-applied representative dummy features.

35. The method of claim 33, wherein the intersection point of two diagonals of the square is within the selected OPC-applied representative dummy feature of the P OPC-applied representative dummy features.

* * * * *